United States Patent
Nagatani

(10) Patent No.: US 7,801,205 B2
(45) Date of Patent: Sep. 21, 2010

(54) JITTER INJECTION CIRCUIT, ELECTRONICS DEVICE, AND TEST APPARATUS

(75) Inventor: Kenichi Nagatani, Tokyo (JP)

(73) Assignee: Advantest Corporation, Tokyo (JP)

( * ) Notice: Subject to any disclaimer, the term of this patent is extended or adjusted under 35 U.S.C. 154(b) by 586 days.

(21) Appl. No.: 11/834,689

(22) Filed: Aug. 7, 2007

(65) Prior Publication Data

US 2009/0041102 A1    Feb. 12, 2009

(51) Int. Cl.
  *H04B 3/46* (2006.01)
(52) U.S. Cl. ...................................... 375/226
(58) Field of Classification Search ................ 375/224, 375/226, 227, 228; 379/22.02, 27.03
  See application file for complete search history.

(56) References Cited

U.S. PATENT DOCUMENTS

| 7,017,087 | B2 | 3/2006 | Panis et al. | |
| 2005/0246603 | A1* | 11/2005 | Rottacker et al. | 714/742 |
| 2007/0061658 | A1* | 3/2007 | Hsu et al. | 714/742 |

* cited by examiner

*Primary Examiner*—Kevin Y Kim
(74) *Attorney, Agent, or Firm*—Jianq Chyun IP Office

(57) ABSTRACT

Provided is a jitter injection circuit that injects jitter having a predetermined amplitude to a transmission signal outputted from a transmission circuit, and inputs the resulting transmission signal to a reception circuit, the jitter injection circuit including: a retiming section that receives the transmission signal from the transmission circuit, and performs retiming on an edge timing of the received transmission signal in accordance with a given clock signal; and a jitter injection section that injects the jitter having the predetermined amplitude to the transmission signal outputted from the retiming section, and inputs the resulting transmission signal to the reception circuit.

17 Claims, 6 Drawing Sheets

JITTER INJECTION CIRCUIT, ELECTRONICS DEVICE, AND TEST APPARATUS

BACKGROUND

1. Technical Field

The present invention relates to a jitter injection circuit, an electronic device, and a test apparatus. In particular, the present invention relates to a jitter injection circuit that injects jitter having a predetermined amplitude to a transmission signal outputted from a transmission circuit and inputs the resulting transmission signal to a reception circuit, an electronic device that includes the jitter injection circuit therein, and a test apparatus that employs the jitter injection circuit.

2. Related Art

A test for measuring the jitter resistance of a device under test is known, as a test for a device under test such as a semiconductor circuit. The test tests the jitter resistance of a device under test, by changing the amplitude of jitter injected to an input signal to the device under test, and measuring the range of the jitter amplitude within which the device under test is able to be normally operated.

Furthermore, a technology to apply the above-mentioned test to a loopback test of a SerDes circuit is also known (e.g. Patent Document 1). In the test, jitter means is used to inject jitter having a desired amplitude to a signal outputted from a transmitter Tx of a SerDes circuit, and the resulting signal is inputted to a receiver Rx of the SerDes circuit. It is possible to measure the jitter resistance of the receiver Rx from the range of the amount of injected jitter within which the receiver Rx is normally operated.

[Patent Document 1] U.S. Pat. No. 7,017,087

For measuring the jitter resistance with accuracy, it is desirable to control the jitter amount included in a signal inputted to the receiver Rx with accuracy. However, the signal inputted to the receiver Rx includes jitter having been generated in the transmitter Tx and the like, in addition to jitter injected by the jitter injection means.

In view of this, in conventional tests, a measurement value of jitter resistance will have an error due to the jitter caused in the transmitter Tx and the like. Although it could be possible to control jitter caused in the transmitter Tx and the like, it is difficult to control the jitter caused in the transmitter Tx and the like, with accuracy.

SUMMARY

In view of this, it is an object of one aspect of the innovations herein to provide a jitter injection circuit, an electronic device, and a test apparatus that are capable of solving the foregoing problems. This object is achieved by combinations of features described in the independent claims. The dependent claims define further advantageous and concrete examples of the present invention.

According to the first aspect related to the innovations herein, one exemplary jitter injection circuit injects jitter having a predetermined amplitude to a transmission signal outputted from a transmission circuit, and inputs the resulting transmission signal to a reception circuit, the jitter injection circuit having: a retiming section that receives the transmission signal from the transmission circuit, and performs retiming on an edge timing of the received transmission signal in accordance with a given clock signal; and a jitter injection section that injects the jitter having the predetermined amplitude to the transmission signal outputted from the retiming section, and inputs the resulting transmission signal to the reception circuit.

According to another aspect related to the innovations herein, one exemplary electronic device includes a transmission circuit that transmits a signal, a reception circuit that receives the signal, a jitter injection circuit that injects jitter having a predetermined amplitude to the transmission signal outputted from the transmission circuit and inputs the resulting transmission signal by loopback to the reception circuit, where the jitter injection circuit includes: a retiming section that receives the transmission signal from the transmission circuit, and performs retiming on an edge timing of the received transmission signal in accordance with a given clock signal; and a jitter injection section that injects the jitter having the predetermined amplitude to the transmission signal outputted from the retiming section, and inputs the resulting transmission signal to the reception circuit.

According to another aspect related to the innovations herein, one exemplary test apparatus injects jitter having a predetermined amplitude to a transmission signal outputted from a transmission circuit and inputs the resulting transmission signal to a reception circuit, thereby testing jitter resistance of the reception circuit, the test apparatus including: a jitter injection circuit that injects the jitter having the predetermined amplitude to the transmission signal outputted from the transmission circuit, and inputs the resulting transmission signal to the reception circuit; and a judgment section that judges whether a logical value of the transmission signal detected by the reception circuit matches a predetermined expected value, for each amplitude of jitter injected to the transmission, signal, where the jitter injection circuit includes: a retiming section that receives the transmission signal from the transmission circuit, and performs retiming on an edge timing of the received transmission signal in accordance with a given clock signal; and a jitter injection section that injects the jitter having the predetermined amplitude to the transmission signal outputted from the retiming section, and inputs the resulting transmission signal to the reception circuit.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
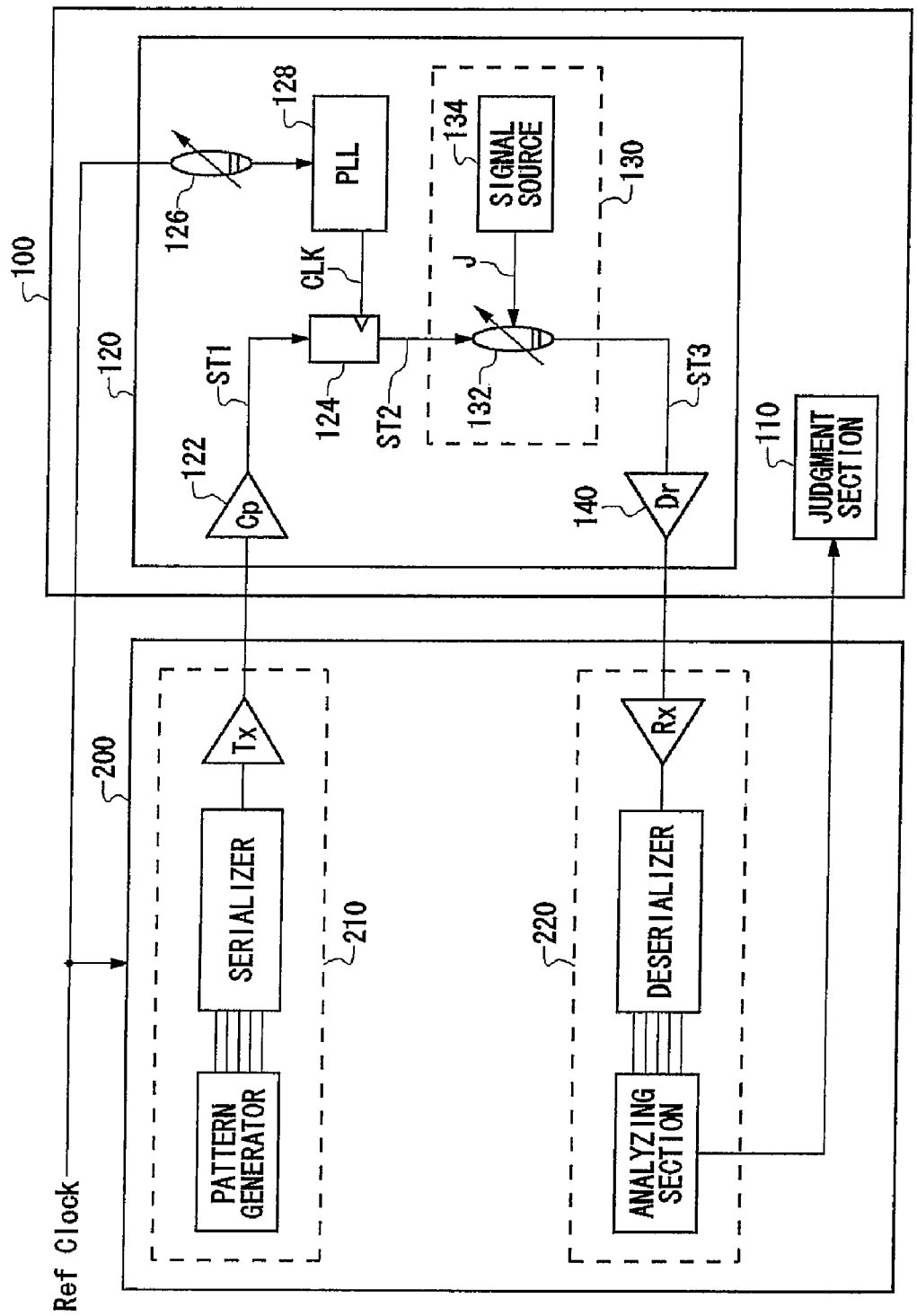
FIG. 1 shows one example of a structure of a test apparatus 100 according to one embodiment of the present invention.

FIG. 1 shows one example of a structure of a test apparatus 100 according to one embodiment of the present invention. A test apparatus 100 tests jitter resistance of a reception circuit 220, by injecting jitter having a predetermined amplitude to a transmission signal outputted from a transmission circuit 210 and inputting the resulting transmission signal to the reception circuit 220.

The transmission circuit 210 and the reception circuit 220 according to the present example are provided in the same chip. For example, the transmission circuit 210 and the reception circuit 220 are a transmission circuit 210 and a reception circuit 220 of a device 200 under test such as a SerDes circuit. The test apparatus 100 of the present example injects jitter to a loopback signal in a loopback test of a SerDes circuit.

The test apparatus 100 includes a jitter injection circuit 120 and a judgment section 110. The jitter injection circuit 120 injects jitter having a predetermined amplitude to a transmission signal outputted from the transmission circuit 210, and inputs the resulting transmission signal to the reception circuit 140. The judgment section 110 judges whether the logical value of the transmission signal detected by the reception circuit 220 matches a predetermined expected value, for each amplitude of jitter injected to the transmission signal.

The jitter injection circuit 120 of the present example gradually changes the amplitude of jitter injected to the transmission signal. Then the judgment section 110 judges whether the logical value of the transmission signal detected by the analyzing section of the reception circuit 220 or the like matches a predetermined expected value, for each amplitude of jitter injected by the jitter injection circuit 120. According to this, the jitter resistance of the reception circuit 220 is able to be measured.

The jitter injection circuit 120 includes a level comparing section 122, a retiming section 124, a phase adjusting section 126, a PLL circuit 128, a jitter injection section 130, and a driver section 140. The level comparing section 122 receives a transmission signal outputted from the transmission circuit 210, compares the signal level of the transmission signal with a pre-set threshold level, and outputs a logical value that is in accordance with the comparison result, as a transmission signal ST1. For example, the level comparing section 122 outputs an H logic when the signal level of the transmission signal outputted form the transmission circuit 210 is larger than the threshold level, and outputs an L logic when the signal level of the transmission signal is smaller than the threshold level.

The retiming section 124 receives a transmission signal from the transmission circuit 210, via the level comparing section 122. The retiming section 124 performs retiming on the edge timing of the received transmission signal ST1, in accordance with a given clock signal CLK. For example, the retiming section 124 outputs a transmission signal ST2, which has undergone retiming so that its respective edge timings are to substantially match the edge timings of the clock signal CLK.

The retiming section 124 of the present example is a flip-flop that receives a transmission signal ST1 at the signal input terminal and receives a clock signal CLK at the clock input terminal. The retiming section 124 performs retiming on the transmission signal by sampling the logical value of the transmission signal ST1 using the clock signal CLK and transmitting the resulting logical value. It should be noted here that the retiming section 124 may have a known configuration that is able to perform retiming of the edge timing described above. For example, the retiming section 124 may be a known sampling circuit.

The PLL circuit 128 generates a clock signal CLK based on a given reference signal RefClock, and supplies the generated clock signal CLK to the retiming section 124. For example, the reference signal RefClock is an operation clock given to the device 200 under test.

The phase adjusting section 126 adjusts the phase of a clock signal CLK outputted from the PLL circuit 128. The phase adjusting section 126 of the present example is a variable delay circuit that delays a reference signal by the delay amount that is in accordance with the phase that the clock signal CLK has to have, and inputs the resulting reference signal to the PLL circuit 128. In a different example, the phase adjusting section 126 may be a variable delay circuit that delays a clock signal CLK outputted from the PLL circuit 128, in accordance with the phase that the clock signal CLK has to have. In this case, it is preferable that jitter caused in the phase adjusting section 126 is small.

According to such a configuration, it becomes possible to supply a clock signal CLK having small jitter to the retiming section 124. For this reason, the retiming section 124 is able to output a transmission signal ST2 having small jitter. In other words, it becomes possible to generate a transmission signal ST2 from which the jitter generated in the transmission circuit 210 is cancelled, while maintaining the data pattern generated by the transmission circuit 210.

It should be noted here that the configuration for generating the clock signal CLK supplied to the retiming section 124 is not limited to the above-described PLL circuit 128, and the like. The retiming section 124 is able to reduce the jitter of a transmission signal, as long as at least the configuration is such as to be able to generate a clock signal CLK having smaller jitter than that of the transmission signal ST1.

The jitter injection section 130 injects jitter J having a predetermined amplitude, to the transmission signal ST2 outputted form the retiming section 124. The jitter injection section 130 includes a variable delay circuit 132 and a signal source 134.

The variable delay circuit 132 outputs a transmission signal ST3 resulting from delaying the transmission signal ST2. The signal source 134 controls the delay amount in the variable delay circuit 132, in accordance with the jitter J to be injected to the transmission signal ST3. For example, by fluctuating the delay amount in the variable delay circuit 132 so that the peak-to-peak value becomes A, it becomes possible to inject jitter having an amplitude A to the transmission signal ST3. According to such a configuration, it becomes possible to inject jitter whose amplitude is accurately controlled, to the transmission signal ST3.

In addition, the signal source 134 is provided so that the jitter amplitude caused in the variable delay circuit 132 is changeable. The signal source 134 may change the jitter amplitude, when notified from the judgment section 110 that the judgment has been performed at the jitter amplitude.

The variable delay circuit 132 inputs the transmission signal ST3 to the reception circuit 220 via the driver section 140. The driver section 140 performs the inputting to the reception circuit 220, without changing the edge timing of the received transmission signal ST3.

As described above, it is possible to reduce the jitter of the transmission signal ST2 by the retiming section 124. Accordingly, it is possible to control the amplitude of jitter injected to the transmission signal ST3, by means of the signal source 134 and with accuracy. As a result, it is possible to measure the jitter resistance of the reception circuit 220 with accuracy.

In addition, the retiming section 124 may be provided in the vicinity of the jitter injection section 130. The retiming section 124 of the present example is provided between the level comparing section 122 and the jitter injection section 130.

Figure 2:
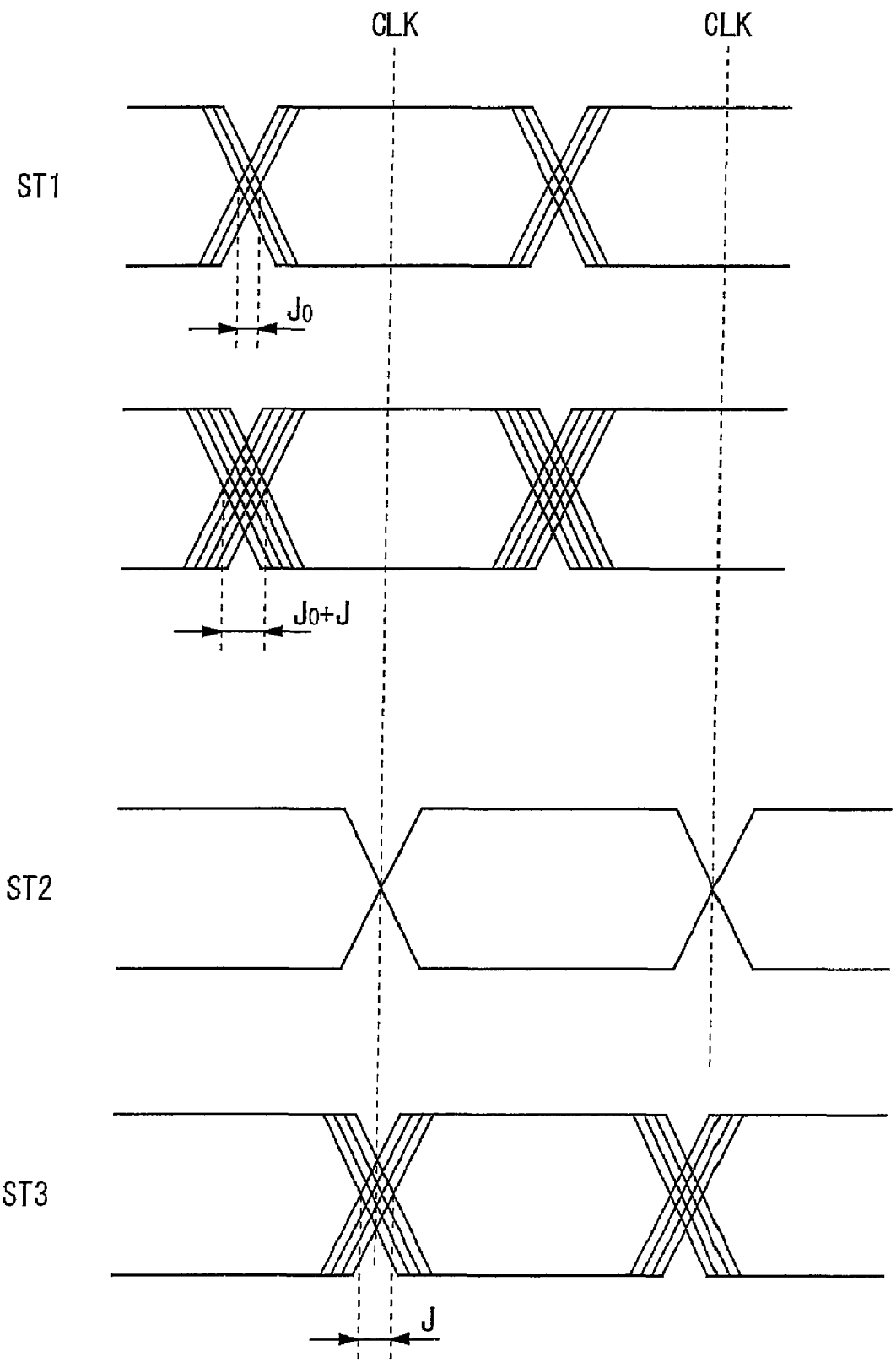
FIG. 2 shows exemplary waveforms respectively of transmission signals ST1, ST2, and ST3 conveyed through a jitter injection circuit 120.

FIG. 2 shows exemplary waveforms respectively of transmission signals ST1, ST2, and ST3 conveyed through the jitter injection circuit 120. The transmission signal ST1 received from the transmission circuit 210 includes jitter J0 caused in the transmission circuit 210. For this reason, when jitter J is injected to the transmission signal ST1, the amplitude of jitter included in the transmission signal ST1 will be J0+J. When jitter resistance of the reception circuit 220 is tested using such a signal, it is not possible to measure the jitter characteristics of the reception circuit 220 with accuracy, since the jitter J0 caused in the transmission circuit 210 is unknown.

As opposed to this, the retiming section 124 of the test apparatus 100 generates a transmission signal ST2 to which retiming has been performed based on the clock signal CLK whose jitter is substantially 0. The edge timing of the clock signal CLK is for example placed in the center of each bit section of the transmission signal ST1.

Accordingly, the jitter included in the transmission signal ST2 outputted from the retiming section 124 will be substantially 0. The jitter injection section 130 injects jitter J to the transmission signal ST2, thereby generating the transmission signal ST3. Accordingly, it is possible to generate a transmission signal whose jitter amplitude has been controlled to be accurate. As a result, it is possible to test the jitter resistance of the reception circuit 220 with accuracy.

I addition, it is also possible to measure the jitter amplitude J0 caused in the transmission circuit 210, with use of the jitter injection circuit 120. An example is to gradually change the delay amount in the phase adjusting section 126. Then the judgment is performed as to whether the logical value outputted from the retiming section 124 matches a predetermined expected value for a predetermined number of times for each delay amount in the phase adjusting section 126. The range of delay amount within which a judgment result that does not match the expected value has caused corresponds to the jitter amplitude J0 caused in the transmission circuit 210. However, since the judgment result is affected by the dead band of the setup/hold in the retiming section 124, it is also possible to calculate the jitter amplitude J0 by subtracting the dead band width of the retiming section 124 from the measured range width of delay amount. The dead band width of the retiming section 124 may be a design value or the like.

Figure 3:
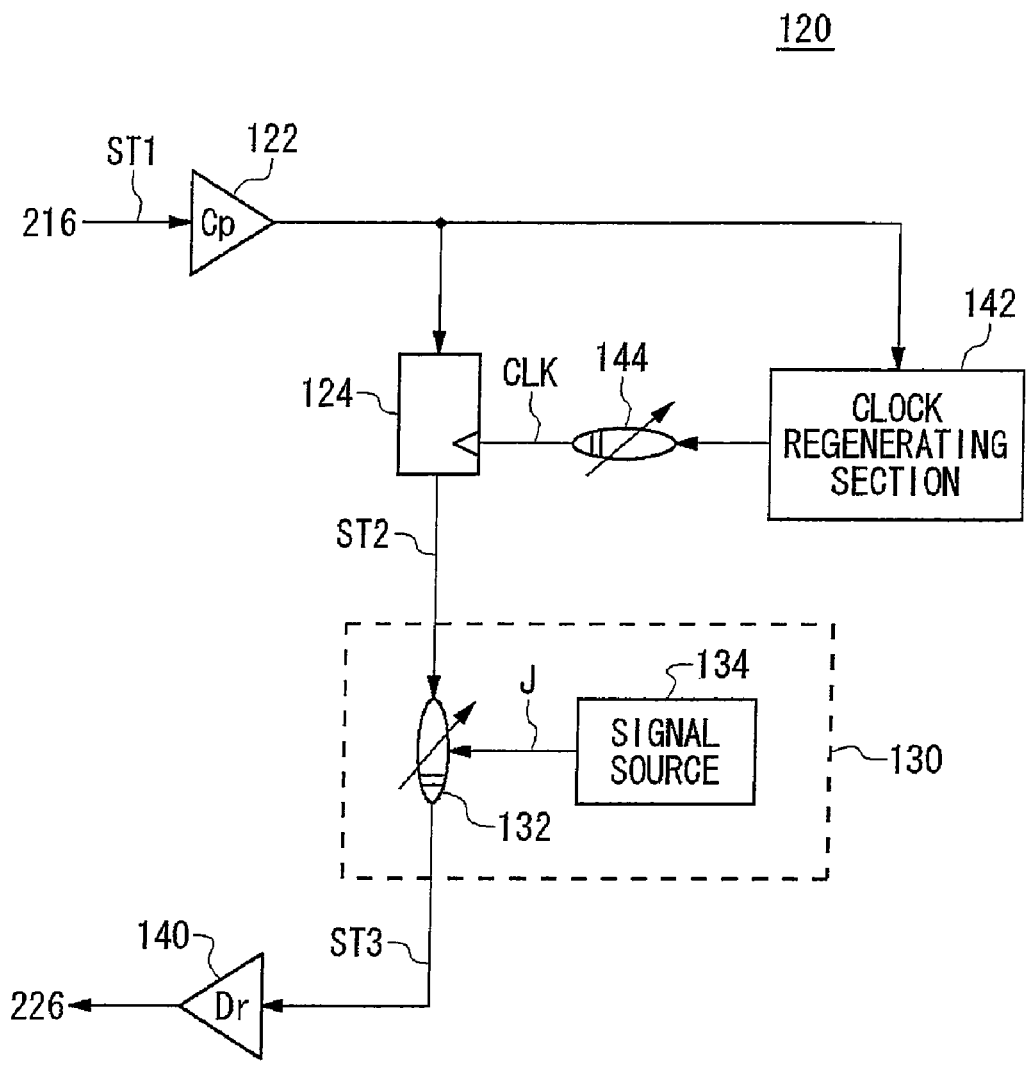
FIG. 3 shows another construction example of the jitter injection circuit 120.

FIG. 3 shows another construction example of the jitter injection circuit 120. The configuration of the jitter injection circuit 120 of the present example is different from the configuration of the jitter injection circuit 120 explained with reference to FIG. 1 in that it includes a phase adjusting section 144 and a clock regenerating section 142, instead of the phase adjusting section 126 and the PLL circuit 128. The other part of the configuration is the same as that of the jitter injection circuit 120 explained with reference to FIG. 1.

The clock regenerating section 142 receives a transmission signal ST1 outputted from the level comparing section 122 after been split, and regenerates, based on the received transmission signal, a clock signal CLK synchronized with the transmission signal. The clock regenerating section 142 may regenerate a clock signal CLK with use of the PLL circuit.

The phase adjusting section 144 adjusts the phase of the clock signal CLK outputted from the clock regenerating section 142. The phase adjusting section 144 of the present example is a variable delay circuit that delays the clock signal CLK outputted from the clock regenerating section 142. In addition, the phase adjusting section 144 may adjust the phase of the clock signal CLK, by delaying the transmission signal ST1 inputted to the clock regenerating section 142.

According to such a configuration, it is possible to generate a clock signal CLK having smaller jitter than that of the transmission signal ST1, thereby performing retiming on the transmission signal ST1. For this reason, it is possible to input the transmission signal ST3 whose jitter amplitude is controlled to be accurate, to the reception circuit 220, and to measure the jitter resistance of the reception circuit 220 with accuracy.

Figure 4:
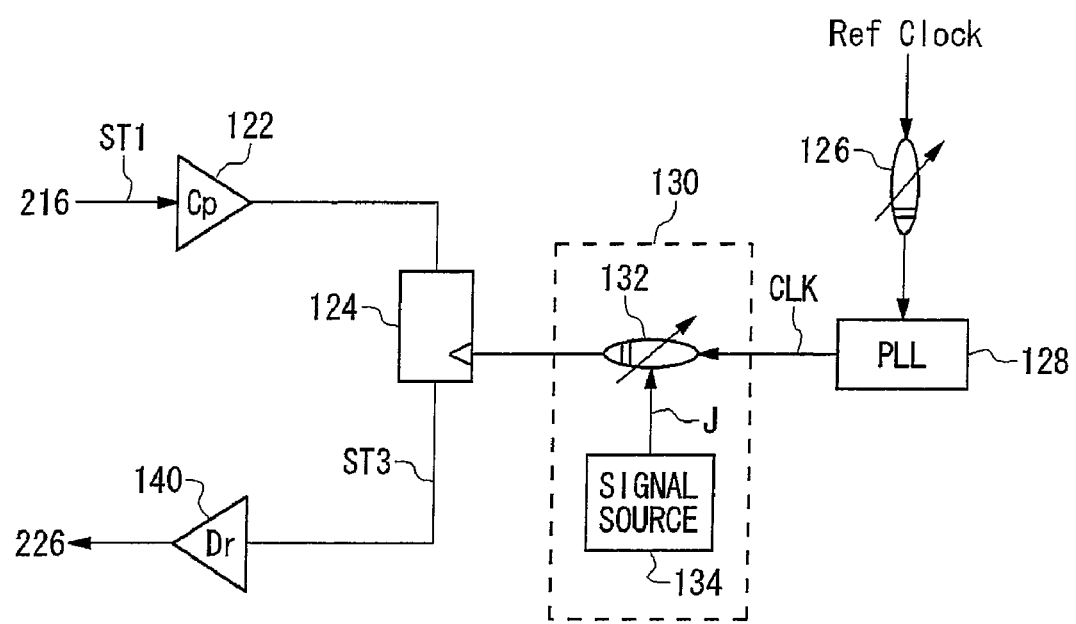
FIG. 4 shows another construction example of the jitter injection circuit 120.

FIG. 4 shows another construction example of the jitter injection circuit 120. The jitter injection circuit 120 of the present example includes a jitter injection section 130 between a PLL circuit 128 and a retiming section 124. The other points may be the same as those in the jitter injection circuit 120 explained with reference to FIGS. 1-3. In addition, also in the configuration of the jitter injection circuit 120 explained in FIG. 4, it is possible to provide the jitter injection section 130 between the clock regenerating section 142 and the retiming section 124.

The jitter injection section 130 receives a clock signal CLK inputted to the retiming section 124, injects jitter J having a predetermined amplitude to the received clock signal CLK, and inputs the resulting clock signal CLK to the retiming section 124. Accordingly, the retiming section 124 performs retiming on the transmission signal ST1 with use of the clock signal CLK to which the jitter J has been injected. As a result, jitter J that is substantially equal to the jitter injected to the clock signal CLK is injected to the transmission signal ST3 outputted from the retiming section 124. According to such a configuration, it is also possible to generate a transmission signal ST3 whose jitter amplitude is controlled to be accurate.

Figure 5:
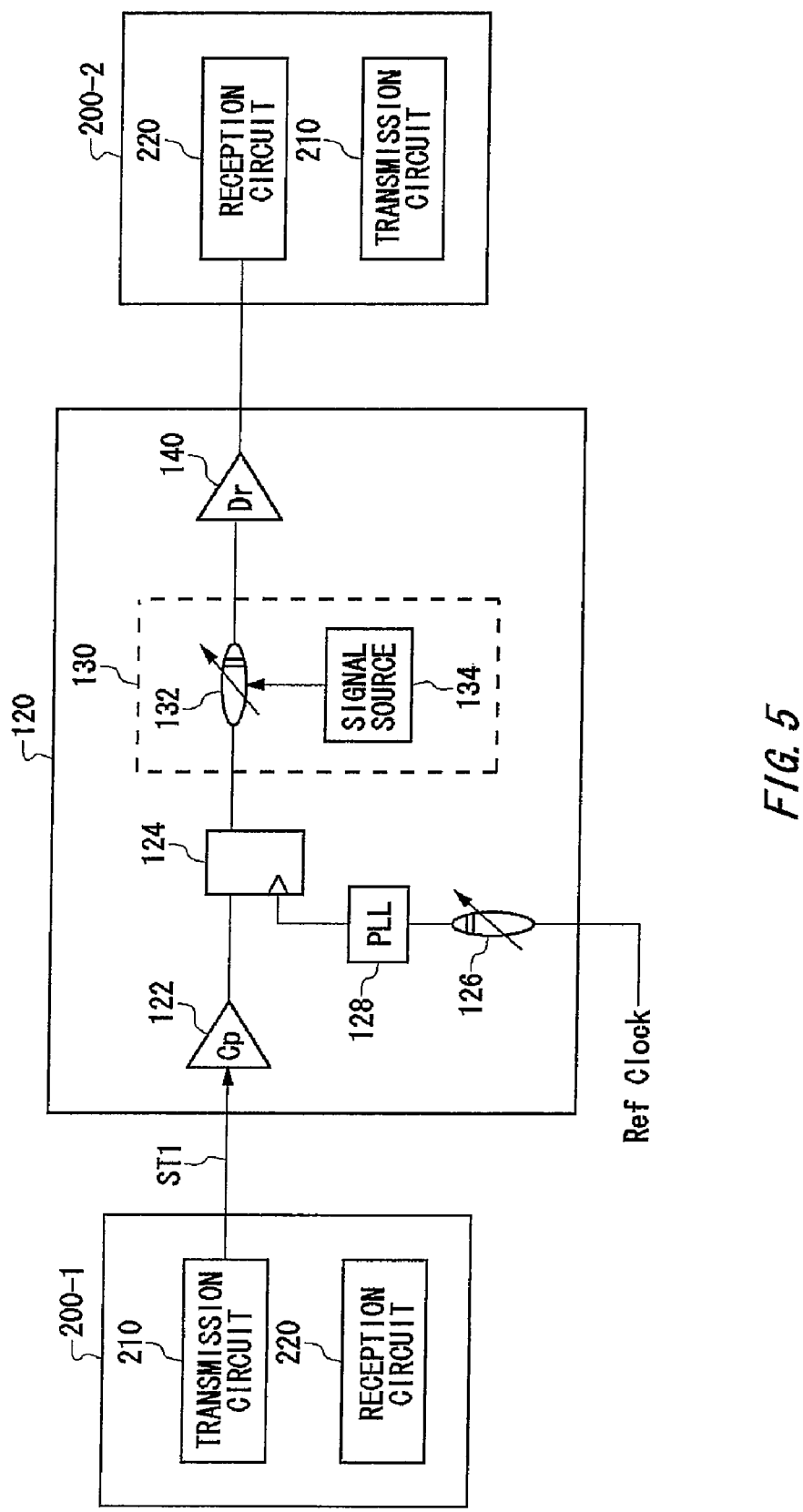
FIG. 5 shows another usage example of the jitter injection circuit 120.

FIG. 5 shows another usage example of the jitter injection circuit 120. The configuration of the jitter injection circuit 120 of the present example is the same as any jitter injection circuit 120 explained with reference to FIGS. 1-4. The jitter injection circuit 120 of the present example injects jitter to a transmission signal received from the transmission circuit 210, and inputs the resulting transmission signal to a reception circuit 220 of a chip different from a chip in which the transmission circuit 210 is provided.

For example, the jitter injection circuit 120 may be provided between a first device 200-1 under test and a second device 200-2 under test. Each of the first device 200-1 under test and the second device 200-2 under test may include both a transmission circuit 210 and a reception circuit 220.

The jitter injection circuit 120 receives a transmission signal from the transmission circuit 210 of the first device 200-1 under test, injects jitter to the transmission signal, and inputs the resulting transmission signal to the reception circuit 220 of the second device 200-2 under test. Accordingly, it is possible to test the jitter resistance of the second device 200-2 under test. The first device 200-1 under test may be a device whose quality has been confirmed to be good in advance.

Figure 6:
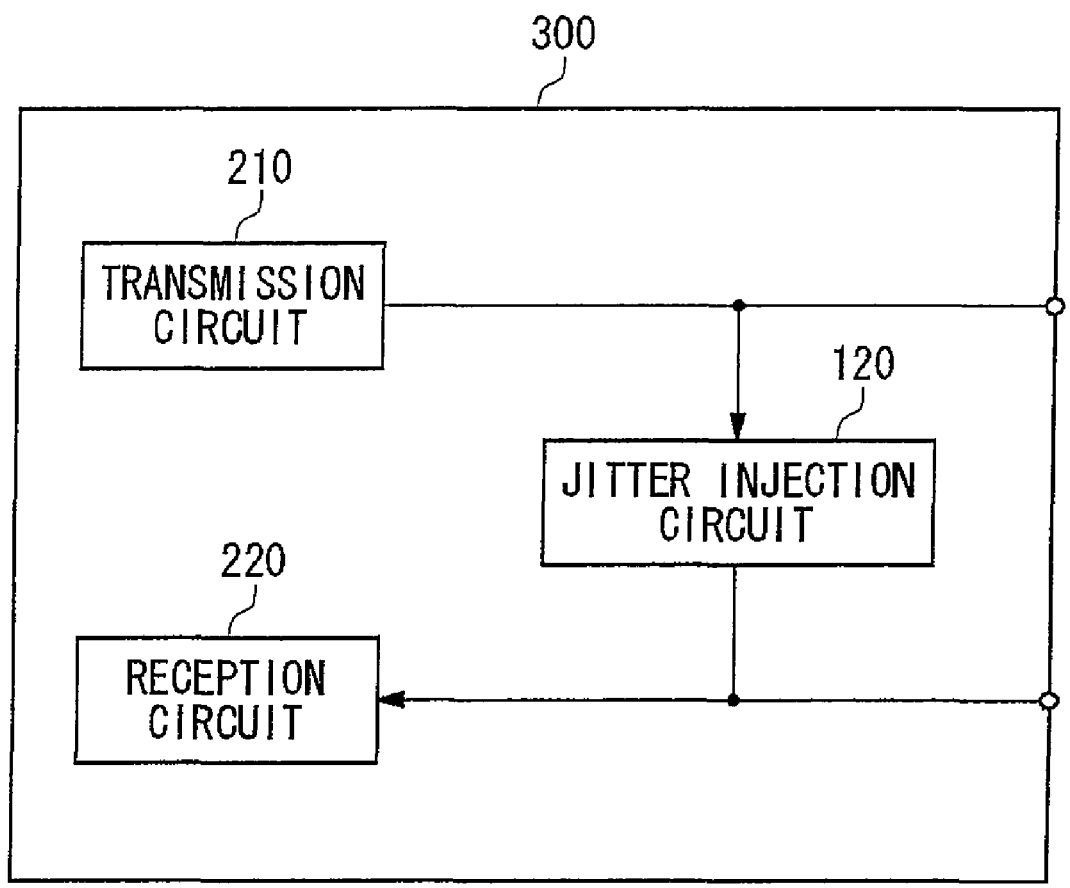
FIG. 6 shows another usage example of the jitter injection circuit 120.

FIG. 6 shows another usage example of the jitter injection circuit 120. The jitter injection circuit 120 of the present example is provided in an electronic device 300 that includes both a transmission circuit 210 and a reception circuit 220. In another example, the jitter injection circuit 120 may be provided in a device that includes either the transmission circuit 210 or the reception circuit 220.

The jitter injection circuit 120 may, at the time of self-diagnosis of the electronic device 300, inject jitter to a transmission signal outputted from the transmission circuit 210, and input the resulting transmission signal to the reception circuit 220 by loopback. The path of the loopback may be provided within the chip of the electronic device 300.

In the above, some aspects of the present invention have been described by way of exemplary embodiments. However, it is needless to say that the technical scope of the present invention should not be limited by the above-described embodiments. It should be understood that those skilled in the art might make various types of modifications and substitutions to the above-described embodiments without departing from the spirit and the scope of the present invention. It is obvious from the appended claims that embodiments with such modifications or substitutions also belong to the technical scope of the present invention.

As clear from the above explanation, according to the embodiment of the present invention, it is possible to input a signal whose jitter amplitude is controlled to be accurate, to a reception circuit whose jitter resistance is to be tested. As a result, it is possible to test the jitter resistance of the reception circuit with accuracy.

What is claimed is:

1. A jitter injection circuit that injects jitter having a predetermined amplitude to a transmission signal outputted from a transmission circuit, and inputs the resulting transmission signal to a reception circuit, the jitter injection circuit comprising:
    a retiming section that receives the transmission signal from the transmission circuit, and performs retiming on an edge timing of the received transmission signal in accordance with a given clock signal;
    a jitter injection section that injects the jitter having the predetermined amplitude to the transmission signal outputted from the retiming section, and inputs the resulting transmission signal to the reception circuit;
    a PLL circuit that generates the clock signal based on a given reference signal; and
    a phase adjusting section that adjusts a phase of the clock signal outputted from the PLL circuit, wherein
    the retiming section performs retiming on the transmission signal, by receiving the clock signal whose jitter amplitude is smaller than a jitter amplitude of the transmission signal, sampling a logical value of the transmission signal using the clock signal, and outputting the resulting logical value, and
    the jitter injection section receives the transmission signal outputted from the retiming section, injects the jitter having the predetermined amplitude to the received transmission signal, and inputs the resulting transmission signal to the reception circuit.

2. The jitter injection circuit as set forth in claim 1, further comprising:
    a level comparing section that receives the transmission signal outputted from the transmission circuit, compares a signal level of the transmission signal with a pre-set threshold level, and outputs a logical value that is in accordance with the comparison result as the transmission signal, wherein
    the retiming section is provided between the level comparing section and the jitter injection section.

3. The jitter injection circuit as set forth in claim 1 that inputs the transmission signal to which jitter has been injected, to the reception circuit provided in a same chip in which the transmission circuit is provided.

4. The jitter injection circuit as set forth in claim 1 that inputs the transmission signal to which jitter has been injected, to the reception circuit provided in a chip different from a chip in which the transmission circuit is provided.

5. An electronic device comprising:
    a transmission circuit that transmits a signal;
    a reception circuit that receives the signal; and
    the jitter injection circuit as set forth in claim 1.

6. A test apparatus that injects jitter having a predetermined amplitude to a transmission signal outputted from a transmission circuit and inputs the resulting transmission signal to a reception circuit, thereby testing jitter resistance of the reception circuit, the test apparatus comprising:
    the jitter injection circuit as set forth in claim 1; and
    a judgment section that judges whether a logical value of the transmission signal detected by the reception circuit matches a predetermined expected value, for each amplitude of jitter injected to the transmission signal.

7. A jitter injection circuit that injects jitter having a predetermined amplitude to a transmission signal outputted from a transmission circuit, and inputs the resulting transmission signal to a reception circuit, the jitter injection circuit comprising:
    a retiming section that receives the transmission signal from the transmission circuit, and performs retiming on an edge timing of the received transmission signal in accordance with a given clock signal;
    a jitter injection section that injects the jitter having the predetermined amplitude to the transmission signal outputted from the retiming section, and inputs the resulting transmission si al to the reception circuit;
    a clock regenerating section that receives the transmission signal, and regenerates the clock signal based on the received transmission signal having been split; and
    a phase adjusting section that adjusts a phase of the clock signal outputted from the clock regenerating section, wherein
    the retiming section performs retiming on the transmission signal, by receiving the clock signal whose jitter amplitude is smaller than a jitter amplitude of the transmission signal, sampling a logical value of the transmission signal using the clock signal, and outputting the resulting logical value, and
    the jitter injection section receives the transmission signal outputted from the retiming section, injects the jitter having the predetermined amplitude to the received transmission signal, and inputs the resulting transmission signal to the reception circuit.

8. The jitter injection circuit as set forth in claim 7, further comprising:
    a level comparing section that receives the transmission signal outputted from the transmission circuit, compares a signal level of the transmission signal with a pre-set threshold level, and outputs a logical value that is in accordance with the comparison result as the transmission signal, wherein
    the retiming section is provided between the level comparing section and the jitter injection section.

9. The jitter injection circuit as set forth in claim 7 that inputs the transmission signal to which jitter has been injected, to the reception circuit provided in a same chip in which the transmission circuit is provided.

10. The jitter injection circuit as set forth in claim 7 that inputs the transmission signal to which jitter has been injected, to the reception circuit provided in a chip different from a chip in which the transmission circuit is provided.

11. An electronic device comprising:
    a transmission circuit that transmits a signal;
    a reception circuit that receives the signal; and
    the jitter injection circuit as set forth in claim 7.

12. A test apparatus that injects jitter having a predetermined amplitude to a transmission signal outputted from a transmission circuit and inputs the resulting transmission signal to a reception circuit, thereby testing jitter resistance of the reception circuit, the test apparatus comprising:
   the jitter injection circuit as set forth in claim 7; and
   a judgment section that judges whether a logical value of the transmission signal detected by the reception circuit matches a predetermined expected value, for each amplitude of jitter injected to the transmission signal.

13. A jitter erection circuit that injects jitter having a predetermined amplitude to a transmission signal outputted from a transmission circuit, and inputs the resulting transmission signal to a reception circuit, the jitter injection circuit comprising:
   a retiming section that receives the transmission signal from the transmission circuit, and performs retiming on an edge timing of the received transmission signal in accordance with a given clock signal; and
   a jitter injection section that injects the jitter having the predetermined amplitude to the transmission signal outputted from the retiming section, and inputs the resulting transmission si al to the reception circuit, wherein
   the jitter injection section receives the clock signal having a smaller jitter amplitude than a jitter amplitude of the transmission signal, injects the jitter having the predetermined amplitude to the received clock signal, and outputs the resulting clock signal, and
   the retiming section receives the clock signal outputted from the jitter injection section, and performs retiming on an edge timing of the transmission signal in accordance with the received clock signal.

14. The jitter injection circuit as set forth in claim 13 that inputs the transmission signal to which jitter has been injected, to the reception circuit provided in a same chip in which the transmission circuit is provided.

15. The jitter injection circuit as set forth in claim 13 that inputs the transmission signal to which jitter has been injected, to the reception circuit provided in a chip different from a chip in which the transmission circuit is provided.

16. An electronic device comprising:
   a transmission circuit that transmits a signal;
   a reception circuit that receives the signal; and
   the jitter injection circuit as set forth in claim 13.

17. A test apparatus that injects jitter having a predetermined amplitude to a transmission signal outputted from a transmission circuit and inputs the resulting transmission signal to a reception circuit, thereby testing jitter resistance of the reception circuit, the test apparatus comprising:
   the jitter injection circuit as set forth in claim 13; and
   a judgment section that judges whether a logical value of the transmission signal detected by the reception circuit matches a predetermined expected value, for each amplitude of jitter injected to the transmission signal.

* * * * *